United States Patent [19]

Nagasawa et al.

[11] Patent Number: 5,390,626
[45] Date of Patent: Feb. 21, 1995

[54] PROCESS FOR FORMATION OF SILICON CARBIDE FILM

[75] Inventors: Hiroyuki Nagasawa, Akishima; Minoru Sugawara, Akigawa; Kazuhide Yamashiro, Hachiouji; Masato Kobayashi, Tokyo; Yohichi Yamaguchi, Higashimurayama, all of Japan

[73] Assignee: Hoya Corporation, Tokyo, Japan

[21] Appl. No.: 37,657

[22] Filed: Mar. 26, 1993

Related U.S. Application Data

[63] Continuation of Ser. No. 804,992, Dec. 10, 1991, abandoned.

[30] Foreign Application Priority Data

Dec. 11, 1990 [JP] Japan .................. 2-0401435

[51] Int. Cl.$^6$ .......................................... C30B 25/02
[52] U.S. Cl. ...................... 117/84; 118/715; 117/88; 117/89; 117/935; 437/100
[58] Field of Search .............. 118/715, 720, 725; 156/611, 613, 614, DIG. 64, DIG. 89; 437/100

[56] References Cited

U.S. PATENT DOCUMENTS

| | | | |
|---|---|---|---|
| 3,865,647 | 2/1975 | Reuschel | 437/100 |
| 4,623,425 | 11/1986 | Suzuki et al. | 156/DIG. 64 |
| 4,897,149 | 1/1990 | Suzuki et al. | 156/610 |
| 4,912,063 | 3/1990 | Davis et al. | 156/DIG. 64 |
| 5,001,380 | 3/1991 | Popov et al. | 310/261 |
| 5,005,075 | 4/1991 | Kobayashi et al. | 378/35 |
| 5,011,549 | 4/1991 | Kong et al. | 156/612 |

FOREIGN PATENT DOCUMENTS

| | | |
|---|---|---|
| 61-199627 | 9/1986 | Japan . |
| 1262500 | 10/1989 | Japan . |
| 2157196 | 6/1990 | Japan . |
| 2262324 | 10/1990 | Japan . |

Primary Examiner—R. Bruce Breneman
Assistant Examiner—Felisa Garrett
Attorney, Agent, or Firm—Nixon Vanderhye

[57] ABSTRACT

In a process for the formation of SiC films by a low pressure CVD method using a hot-wall type, a dichlorosilane gas and an acetylene gas are used as a source gas, the flow velocity of the source gases in a reactor is set at not less than 70 cm/second, and the temperature for heating the reactor is set at not more than 1,000° C., whereby SiC films having excellent uniformity in the film thickness and film properties on the surface of one substrate and among different substrates can be produced at a high mass productivity without causing any damage to the reactor from heat during the film formation.

10 Claims, 4 Drawing Sheets

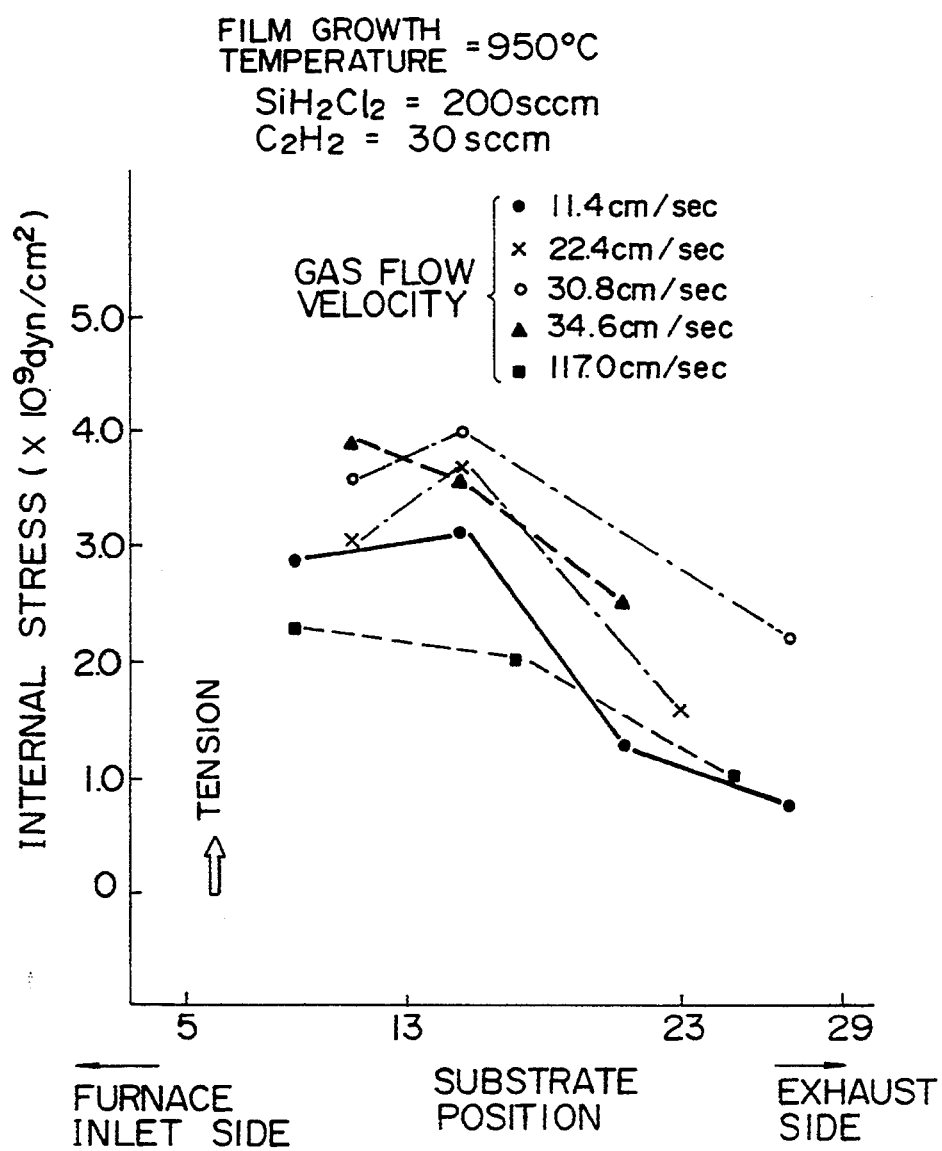

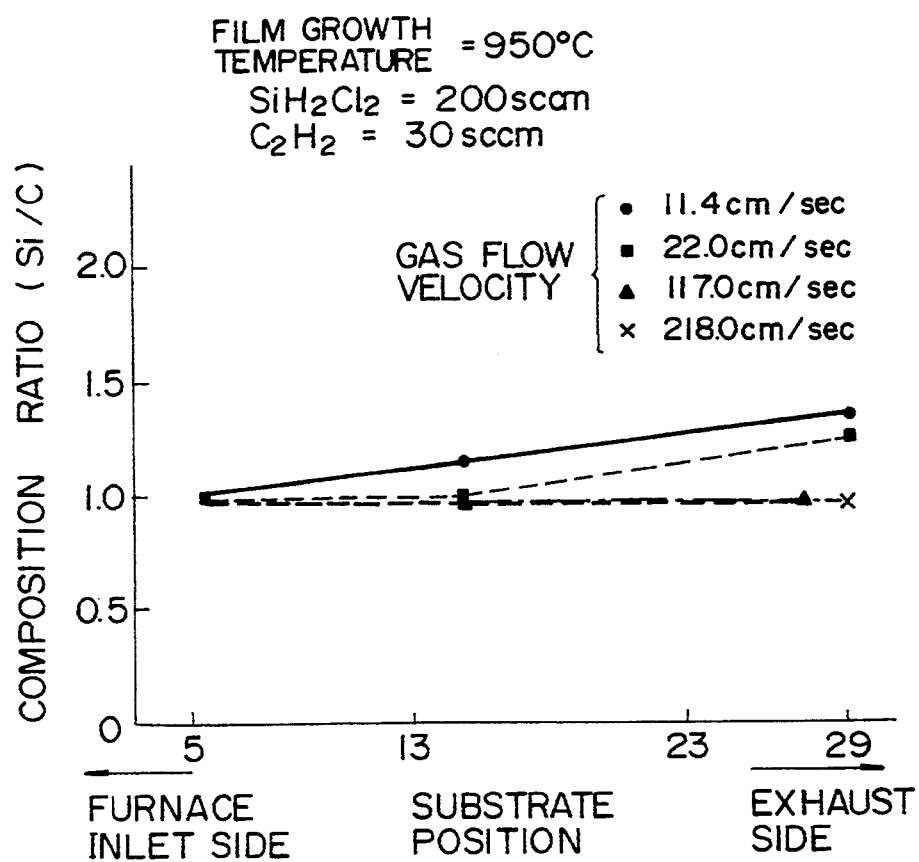

PROCESS FOR FORMATION OF SILICON CARBIDE FILM

This is a continuation of application Ser. No. 07/804,992, filed Dec. 10, 1991, now abandoned.

FIELD OF THE INVENTION

The present invention relates to a process for the formation of a silicon carbide (SIC) film to be used as a substrate material for a semiconductor device or as an X-ray transmissive film for an X-ray mask. In particular, it relates to a process for the formation of a silicon carbide film by a low pressure CVD method using a hot-wall system.

PRIOR ART OF THE INVENTION

The following systems are available for the formation of an SiC film on a substrate by a CVD method, i.e., a cold-wall system in which a substrate is placed on a susceptor having a surface coated with SiC having a thickness of some hundreds μm, and an SiC film is formed on the substrate while the substrate is heated by means of thermal conductivity from the inductively heated susceptor, and a hot-wall system in which an SiC film is formed on a substrate while the substrate is indirectly externally heated by heating a reactor (generally made of quartz) with a heater provided on a peripheral surface of the reactor. When the pressure used for these two systems, atmospheric pressure or reduced pressure, is taken into consideration, there are four film-forming methods.

Since, however, the temperature for the formation of an SiC film is generally 1,300° C. or higher, it is necessary to prevent a damage to a reactor. Therefore, an atmospheric pressure or low pressure CVD method using a cold-wall system is applied to a process for the formation of an SiC film by a CVD method.

The SiC film formation based on an atmospheric pressure or low pressure CVD method using a cold-wall system is generally carried out by a carbonization method (e.g., Appl. Phys. Lett., Vol. 42, No. 5, pages 480–462 (1985)) or by a two-temperature continuous method (e.g., J. Crys. Growth, Vol. 70, pages 287–290, (1984)). Both these methods involve a rapid increase or a rapid decrease in the temperature of a substrate. However, since the reactor itself has a low temperature, the damage to the reactor due to high temperature during the SiC film formation scarcely occurs. On the other hand, the above methods have the following problems. Since substrate(s) is(are) heated through susceptor(s), the uniformity of the SiC film thickness or the SiC film properties on the surface of one substrate or among different substrates is poor as compared with that of film(s) obtained by a CVD method using a hot-wall system. Further, since a substrate is to be placed on a susceptor, the number of substrates that can be treated during one film-forming operation is limited, and the mass productivity is lower than that of a CVD method using a hot-wall system.

It is therefore desired to apply an atmospheric pressure or low pressure CVD method using a hot-wall system to the production, at a high mass productivity, of SiC films which are so excellent in the film thickness uniformity that the film thickness variability on the surface of one substrate or among different substrates is, for example, about 5 % or less and which are also excellent in the film properties on the surface of one substrate or among different substrates.

However, when an SiC film is formed by a conventional atmospheric pressure or low pressure CVD method using a hot-wall system, the film formation is carried out while the reactor itself is heated to a temperature equivalent to or higher than the temperature for the formation of the SiC film. There is therefore a problem in that the reactor is damaged due to high temperature during the film formation as described above. The temperature for the formation of an SiC film can be decreased by the use, as one of source gases, of a highly reactive gas such as acetylene ($C_2H_2$) and dichlorosilane ($SiH_2Cl_2$). However, the problem with the use of such a highly reactive gas in a conventional CVD method using a hot-wall system is that since the source gas concentration distribution in the reactor is rendered nonuniform, no SiC film having excellent uniformity in the film thickness and film properties can be obtained.

It is therefore an object of the present invention to provide a process for the formation of an SiC film, which permits the production, at a high mass productivity, of an SiC film which is excellent in uniformity of the film thickness and film properties on the surface of one substrate and among different substrates without causing any damage to the reactor from heat during the film formation.

SUMMARY OF THE INVENTION

The above object of the present invention is achieved by a process for the formation of a silicon carbide Film which comprises placing at least one substrate in a reactor of a CVD apparatus using a hot-wall system, and introducing a plurality of source gases into the reactor under reduced pressure while the reactor is heated, thereby to form a silicon carbide film on the substrate in the reactor, wherein the source gases comprise at least a dichlorosilane gas and an acetylene gas, the flow velocity of the source gases in the reactor is not less than 70 cm/second, and the temperature for heating the reactor is not more than 1,000° C.

In the above process, the flow velocity of the source gases is influenced by the pressure in the reactor. In order to keep a flow velocity of not less than 70 cm/second in all of the inlet side, the central portion and the exhaust side of the reactor, it is therefore preferable to adjust the pressure in the reactor to not more than 5 Torr. However, when the pressure in the reactor is too low, the growth rate of the SiC film decreases. It is therefore preferable to adjust the pressure to not less than 0.01 Torr in order to attain high mass productivity.

In the process of the present invention for the formation of an SiC film by a hot-wall low pressure CVD system using a dichlorosilane gas and an acetylene gas, the temperature for the formation of the SiC film can be at not more than 1,000° C. Therefore, almost no damage occurs to the reactor by high temperature during the film formation.

Further, due to the use of the above source gases, a sufficiently high film growth rate can be maintained even at a film growth temperature of not more than 1,000° C. Moreover, due to the hot-wall system, the number of substrates treated in one film-forming operation is large. That is, the process of the present invention is excellent in mass productivity.

Further, since the flow velocity in the reactor is set at not less than 70 cm/second, the concentration distribution of the source gases in the reactor is rendered uniform. As a result, there can be obtained SiC films which are excellent in the uniformity of the film thickness and film properties on the surface of one substrate and among different substrates.

BRIEF DESCRIPTION OF THE DRAWINGS

FIG. 3 is a graph showing the relationship between the degree of internal stress of each of SiC films obtained by variously changing the flow velocity of source gases in a reaction tube and the position where each of substrates was placed.

FIG. 4 is a graph showing the relationship between the composition ratio of each of SiC films obtained by variously changing the flow velocity of source gases in a reaction tube, and the position where each of the substrates was placed.

The present invention will be detailed hereinafter by reference to Example and Comparative Example.

EXAMPLE AND COMPARATIVE EXAMPLE

Silicon wafers ((100) face, resistivity 0.5–5.0 Ω/cm, N-type) having a diameter of 76±0.5 mm (3 inches) and a thickness of 380±10 μm were used as a substrate on which an SiC film was to be formed. A dichlorosilane gas ($SiH_2Cl_2$) and an acetylene gas ($C_2H_2$) were used as a source gas, and a hydrogen gas ($H_2$) was used as a carrier gas.

Figure 1:
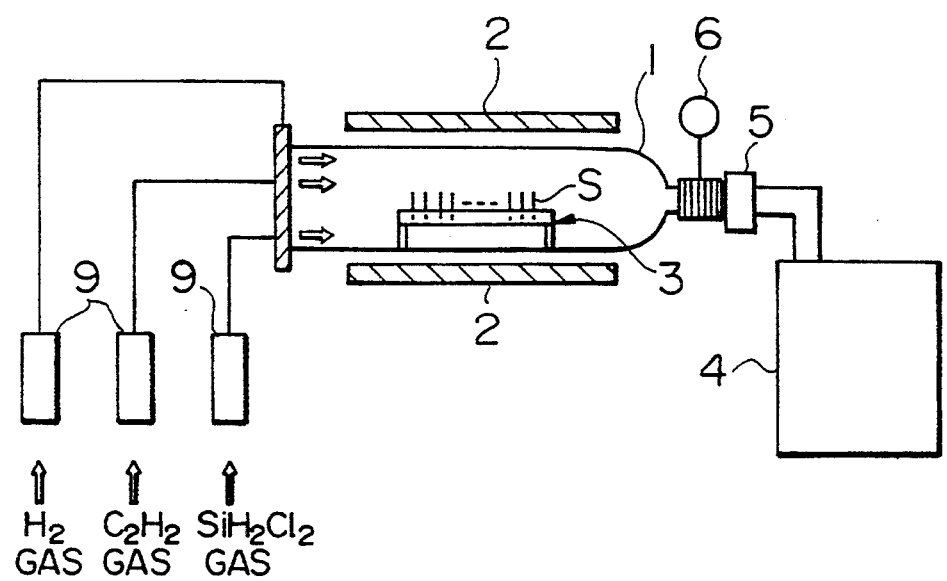
FIG. 1 is a schematic view of a hot-wall type low pressure CVD system used in Example.

FIG. 1 shows a resistance heating method-applied hot-wall low pressure CVD system used for the formation of SiC films in this Example. In FIG. 1, numeral 1 indicates a horizontal reaction tube, numeral 2 indicates a resistance heating type heater provided on a peripheral surface of the reaction tube 1, numeral 3 is a quartz-made substrate holder, numeral 4 indicates an exhaust pump, numeral 5 indicates a butterfly valve, numeral 6 indicates a Pirani gauge, and numeral 9 indicates a mass flow controller.

As shown in FIG. 1, thirty-three substrates S were vertically placed on the substrate holder S at intervals of 5 mm, and the pressure in the reaction tube 1 was reduced to a vacuum of $1.0 \times 10^{-3}$ Torr by actuating the exhaust valve 4. Then, $SiH_2Cl_2$, $C_2H_2$ and $H_2$ were introduced into the reaction tube 1 at a predetermined flow velocity. In this case, the flow velocity of the source gases in the reaction tube was variously changed by changing the pressure in the reaction tube, whereby SiC films were formed on the substrates S. The temperature in the reaction tube (corresponding to a film growth temperature) was varied in the range between 800° C. and 1,000° C.

In addition, the reaction tube 1 was heated with the heater 2, and when the reaction tube 1 was heated, each of the substrates S was also indirectly heated. The temperature in the reaction tube 1 was indirectly measured with a thermocouple (not shown) provided in the vicinity of the heater 2. The flow velocity of the source gases was controlled by changing the pressure in the reaction tube under the adjustment of the butterfly valve 5 provided just before the exhaust pump 4. The source gases introduced into the reaction tube underwent a reaction due to thermal excitation to form an SiC film on each of the substrates S.

Table 1 shows the film growth conditions.

TABLE 1

| Substrate | Si (100) wafer |
| --- | --- |
| Growth temperature | 800–1,000° C. |
| Flow amounts of source gases | |
| $SiH_2Cl_2$ | 200 sccm |
| $C_2H_2$ | 30 sccm |
| Flow velocity of source gases | 11.4–230 cm/second |
| Pressure in reaction tube | 0.10–10 Torr |

Figure 2:
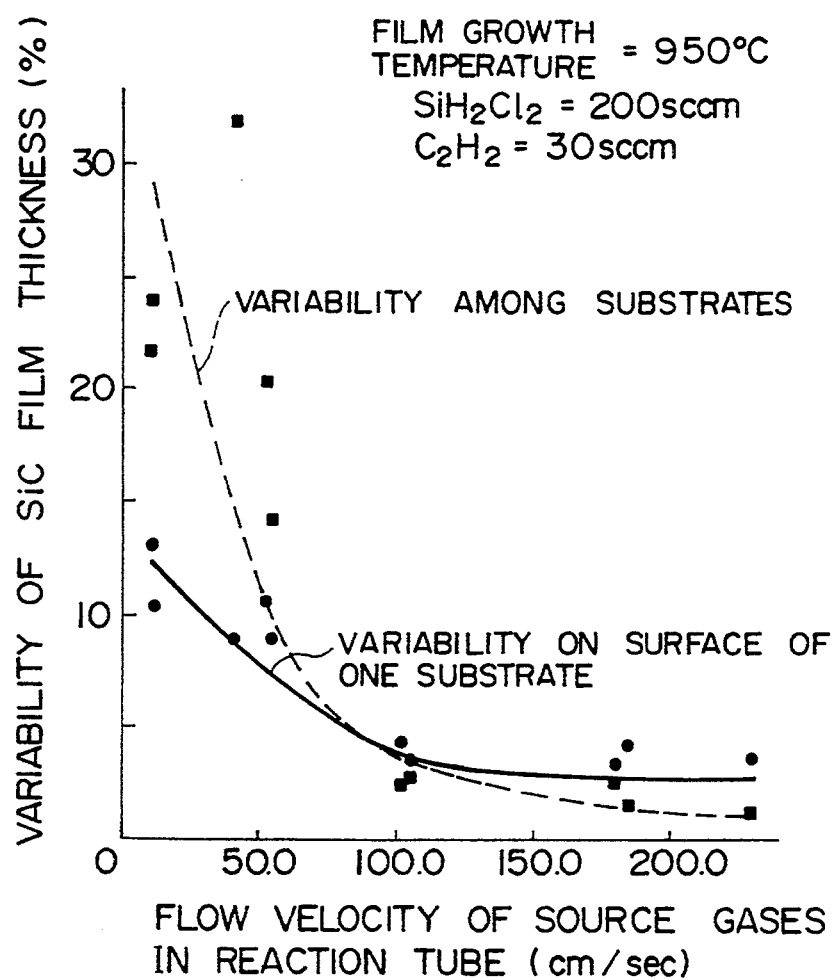
FIG. 2 is a graph showing the film thickness variability of an SiC film on the surface of one substrate and the film thickness variability of SiC films among substrates when the flow velocity of source gases in a reaction tube was variously changed.

Each of the SiC films obtained by changing the film growth conditions as above was measured for a thickness on the basis of reflection spectrum of visible light beam. The film thickness variability on the surface of one substrate and the variability among substrates were expressed by percentages of $3\delta_{n-1}$ ($n \geq 17$) to an average of the measured film thickness values, and the films were evaluated on uniformity of film thickness according to the percentages. FIG. 2 shows the variabilities in film thicknesses of SiC films formed at 950° C. on the surface of one substrate and among different substrates.

FIG. 2 clearly shows the following. The film thickness variabilities decreased with an increase in the flow velocity of the source gases, and when the flow velocity of the source gases was adjusted to not less than 70 cm/second defined in the present invention, both the film thickness variability on the surface of one substrate and the film thickness variability among substrates were reduced to about 5% or less. That is, when the flow velocity of the source gases was adjusted to not less than 70 cm/second, SiC films having excellent uniformity in film thickness were obtained.

Further, as one method of evaluation, among substrates, of the properties of SiC films obtained by variously changing the film growth conditions, the degrees of internal stresses in the SiC films were compared. FIG. 3 shows the degrees of internal stresses of the SiC films formed at 950° C.

FIG. 3 clearly shows the following. The variability (among substrates) of the degrees of internal stresses of the SiC films caused by a positional difference among the substrates in the reaction tube decreased with an increase in the flow velocity of the source gases, and this variability was further decreased by adjusting the flow velocity of the source gases to the range defined in the present invention. That is, SiC films having excellent uniformity of film properties among the substrates were obtained.

Further, as another method of evaluation, among substrates, of the properties of SiC films obtained by variously changing the film growth conditions, composition ratios of the SiC films were compared. FIG. 4 shows the composition ratios of the SiC films formed at 950° C.

FIG. 4 clearly shows the following. The tendency to vary in the composition ratio of the SiC film, caused by a positional difference among the substrates in the reaction tube, i.e., the tendency of the substrates near the exhaust side toward formation of Si-richer SiC films, decreased with an increase in the flow velocity of the source gases. When the flow velocity of the source gases was adjusted to the range defined in the present invention, i.e., 117.0 cm/second and 218.0 cm/second even the substrates on the exhaust side had SiC films having a composition ratio of nearly 1. That is, SiC films having uniformity in the film properties among substrates were obtained.

In addition, no damage to the reaction tube by heat during the film formation was recognized under any of the film growth conditions.

In addition to the above Example, the present invention includes the following application embodiments and variations.

1) In addition to silicon wafers used in Examples, there may be used other substrates of glass, SIC, and the like.

2) In Example, the substrates having a diameter of 3 inches were used for making clear the effects produced by an increase in the flow velocity of the source gases and the effect produced by a decrease in the temperature for forming films, whereas the substrate used in the present invention is not specially limited with regard to the size and form, and there may be used substrates having a diameter or a maximum length of 5 inches or less and having any form.

3) In Example, SiC films were formed on 33 substrates in one film-forming operation for making clear the effects produced by an increase in the flow velocity of the source gases and the effect produced by a decrease in the temperature for the formation of films, whereas the number of substrates to be placed in the reaction tube for one film-forming operation is not specially limited, and may be properly selected. And these effects can be exhibited regardless of the number of substrates placed in the reaction tube.

4) In Example, the pressure in the reaction tube was changed by adjusting the butterfly valve so that the flow velocity of the source gases in the reaction tube was adjusted, whereas the flow velocity of the source gases in the reaction tube can be adjusted by controlling the amount of the carrier gas to be introduced per a unit time or the amounts of the source gases to be introduced per a unit time.

As specified above, the present invention permits the production, at a high mass productivity, of SiC films having excellent uniformity in the film thickness and film properties on the surface of one substrate and among different substrates without causing any damage to the reactor from heat during the film formation.

What is claimed is:

1. A process for the formation of a silicon carbide film which comprises placing at least one substrate in a reactor of a CVD system using a hot-wall, and introducing a plurality of source gases into the reactor under reduced pressure while the reactor is heated, thereby to form a silicon carbide film in which the composition ratio of Si to C is about 1 on the substrate in the reactor, wherein the source gases comprise at least a dichlorosilane gas and an acetylene gas, the flow velocity of the source gases in the reactor is at least 70 cm/second, and the temperature for heating the reactor is not more than 1,000° C.

2. A process according to claim 1, wherein the reactor is adjusted to a pressure between 0.01 Torr and 5 Torr.

3. A process according to claim 1, wherein the substrate is selected from the group consisting of a silicon wafer, glass and SiC.

4. A process according to claim 1, wherein a carrier gas is introduced into the reactor together with the source gases.

5. A process according to claim 4, wherein the carrier gas is a hydrogen gas.

6. A process according to claim 1, wherein the temperature for heating is between 800° C. and 1,000° C.

7. A process according to claim 1, wherein the flow velocity of the source gases in the reactor is adjusted by changing a pressure in the reactor.

8. A process according to claim 1, wherein the flow velocity of the source gases in the reactor is adjusted by controlling an amount of a carrier gas to be introduced per a unit time.

9. A process according to claim 1, wherein the flow velocity of the source gases in the reactor is adjusted by controlling an amount of the source gases to be introduced per a unit time.

10. An X-ray transmissive film containing a silicon carbide film obtained by the process recited in claim 1.

* * * * *